United States Patent [19]

Hupfer et al.

[11] Patent Number: 5,198,325

[45] Date of Patent: Mar. 30, 1993

[54] PHOTOPOLYMERIZABLE MIXTURE, COPYING MATERIAL CONTAINING SAME AND PROCESS FOR PRODUCING HIGHLY HEAT-RESISTANT RELIEF STRUCTURES WHEREIN A TRIHALOMETHYL IS THE PHOTOINITIATOR

[75] Inventors: Bernd Hupfer, North Kingstown, R.I.; Gerhard Buhr, Koenigstein; Charlotte Eckes, Mainz-Gonsenheim, both of Fed. Rep. of Germany

[73] Assignee: Hoechst Aktiengesellschaft, Frankfurt am Main, Fed. Rep. of Germany

[21] Appl. No.: 199,296

[22] Filed: May 26, 1988

[30] Foreign Application Priority Data

May 27, 1987 [DE] Fed. Rep. of Germany ....... 3717933

[51] Int. Cl.⁵ ...................... G03F 7/037; G03F 7/031
[52] U.S. Cl. .................................... 430/283; 430/285; 430/287; 430/325; 430/330; 522/63; 522/67; 522/34
[58] Field of Search ............... 430/330, 326, 325, 283, 430/271, 286, 287; 522/63, 53, 67, 34

[56] References Cited

U.S. PATENT DOCUMENTS

| | | |
|---|---|---|
| 3,779,778 | 12/1973 | Smith et al. ............... 96/115 R |
| 3,954,475 | 5/1976 | Bonham et al. ............ 96/67 |
| 3,957,512 | 5/1976 | Kleeberg ................... 96/35.1 |
| 3,987,037 | 10/1976 | Bonham et al. ............ 260/240 D |
| 4,040,831 | 1/1977 | Rubner ...................... 430/325 |
| 4,045,223 | 8/1977 | Rubner et al. ............. 96/35.1 |
| 4,088,489 | 5/1978 | Rubner et al. ............. 96/35.1 |
| 4,101,323 | 7/1978 | Buhr et al. ................. 96/35 |
| 4,189,323 | 2/1980 | Buhr ........................... 430/281 |
| 4,329,419 | 5/1982 | Goff et al. .................. 430/283 |
| 4,369,247 | 1/1983 | Goff et al. .................. 430/311 |
| 4,410,612 | 10/1983 | Goff et al. .................. 430/18 |
| 4,414,312 | 11/1983 | Goff et al. .................. 430/283 |
| 4,579,809 | 4/1986 | Irving ......................... 430/283 |
| 4,619,998 | 10/1986 | Buhr ........................... 430/495 |
| 4,696,888 | 9/1987 | Buhr ........................... 430/925 |
| 4,701,300 | 10/1987 | Merren et al. .............. 430/283 |
| 4,774,163 | 9/1988 | Higashi ....................... 522/63 |

FOREIGN PATENT DOCUMENTS

| | | |
|---|---|---|
| 131992 | 1/1985 | European Pat. Off. |
| 3227584 | 1/1984 | Fed. Rep. of Germany |
| 3333450 | 4/1985 | Fed. Rep. of Germany |

OTHER PUBLICATIONS

J. Kosar, "Light–Sensitive Systems: Chemistry and Application of Non–Silver Halide Photographic Processes", 1965, pp. 180–181.

*Primary Examiner*—Charles L. Bowers, Jr.
*Assistant Examiner*—John S. Chu
*Attorney, Agent, or Firm*—Foley & Lardner

[57] ABSTRACT

A photopolymerizable mixture for producing relief structures composed of highly heat-resistant polymers is described which is composed essentially of a soluble prepolymer containing photosensitive radicals bound in an ester-like manner to carboxyl groups, monomers and a photoinitiator, wherein the photoinitiator carries at least one trihalomethyl group which reacts when exposed to light. Of advantage is the fact that, even after exposure times which are by a factor of 4 to 5 shorter compared with conventional photopolymerizable mixtures, sharp-edged resist images can be obtained with a resolution of less than 3 μm.

20 Claims, No Drawings

PHOTOPOLYMERIZABLE MIXTURE, COPYING MATERIAL CONTAINING SAME AND PROCESS FOR PRODUCING HIGHLY HEAT-RESISTANT RELIEF STRUCTURES WHEREIN A TRIHALOMETHYL IS THE PHOTOINITIATOR

BACKGROUND OF THE INVENTION

The invention relates to photoresists containing soluble polymer precursors (prepolymers) carrying unsaturated radicals bound in an ester-like manner to carboxyl groups, monomers and photoinitiators for forming relief structures composed of highly heat-resistant polymers.

Photoresists for forming relief structures composed of highly heat-resistant polymers are used on a large scale in the production of electrical and electronic components, in etching resists and electroplating resists or in printing forms.

Photoresists of this type are applied to a substrate in the form of a layer or film, and the layer or film is dried and subsequently exposed through a negative original. A crosslinking takes place at the exposed points, as a result of which the solubility at those points is drastically reduced. The regions which were not exposed are removed by dissolving (development) or peeling apart. The photocured relief structures left behind may then be converted by postcuring at relatively high temperatures into highly heat-resistant polymers which withstand temperatures of 250°–400° C. without adverse effects, for example on edge acuity and resolution.

According to German Patent No. 2,308,830, such photoresists contain soluble polymer precursors, so-called prepolymers. These prepolymers are, for example, polyaddition or polycondensation products of carbocyclic or heterocyclic compounds containing two functional groups capable of polyaddition or polycondensation reactions, and also, at least partially, in the associated ortho or peri position, radiation-reactive radicals bound in an ester-like manner to carboxyl groups (hereinafter termed ring compounds I) and diamines, diisocyanates, bis(acid chlorides) or dicarboxylic acids which in each case contain at least one cyclic structural element (hereinafter termed ring compounds II). However, if the prepolymers cited in German Patent No. 2,308,830 are used, 8–15 minutes of exposure are necessary to ensure an adequate crosslinking of the photoresists containing the prepolymers. These exposure times cannot be appreciably reduced even by adding the usual photosensitizers.

In the patent of addition to German Patent No. 2,308,830, German Patent No. 2,437,348, the prepolymers in the photoresist are modified in that, instead of the radiation-reactive radicals bound in an ester-like manner to carboxyl groups specified therein, oxyalkyl acrylate or oxyalkyl methacrylate groups bound in an ester-like manner to carboxyl groups are used. This is said to achieve a reduction in the exposure times. However, even the use of such photoresists for the mass production of electronic components is critical owing to the exposure times which are still too long.

A further increase in the photosensitivity of photoresists and a shortening, associated therewith, of the exposure times is described in European Patent Application No. 0,047,184, in which a polymerizable polyfunctional acrylate compound (monomer) and an aromatic bisimidazole photoinitiator, optionally substituted by halogen on the nucleus, are added to a soluble amide ester prepolymer. Although these photoresists exhibit a good photosensitivity, the addition of bisimidazole photoinitiators has disadvantages. Thus, for example, bisimidazole compounds in the resist solution may result in undesirable premature polyimide formation in the solution, as a result of which the shelf life of the photoresist solution is considerably reduced.

SUMMARY OF THE INVENTION

It is therefore the object of the present invention to modify a photopolymerizable mixture in a manner such that a crosslinking adequate for use as films and layers is achieved even after markedly shorter exposure times than hitherto usual but, on the other hand, the stability of the photoresist solution is not impaired.

In accordance with these and other objects of the invention there is provided a photopolymerizable mixture for producing a relief structure comprising highly heat-resistant polymers, said mixture comprising a soluble polymer precursor having at least one unsaturated radical bound by an ester-linkage to a carboxyl group; at least one monomer; and a photoinitiator having at least one trihalomethyl group that reacts on exposure to light. The present invention also provides a photosensitive copying material comprising a substrate and a layer of the photopolymerizable mixture. A process is also provided for producing highly heat-resistant relief structures, comprising the steps of applying a solvent solution of a photosensitive photopolymerizable mixture as defined above to form a layer, removing the solvent by heating the layer to temperatures of up to 100° C., imagewise exposing the layer, and developing the layer to produce a relief structure.

DESCRIPTION OF PREFERRED EMBODIMENTS

The present invention provides photopolymerizable mixtures for producing relief structures composed of highly heat-resistant polymers of the class described in the introduction, wherein the photoinitiator carries at least one trihalomethyl group which reacts on exposure to light. The subject of the invention is furthermore a copying material consisting of a carrier and a photosensitive layer which is composed of the photopolymerizable mixture according to the invention, and also a process for producing highly heat-resistant relief structures from this copying material.

The soluble polymer precursors contained in the photosensitive mixtures (photoresists) according to the invention are identical to the usual soluble polymer precursors which can be converted by exposure and optional postcuring into highly heat-resistant polymers. Such soluble polymer precursors are described, for example, in German Patent No. 2,308,830, German Patent No. 2,437,348, German Patent No. 2,437,368, German Patent No. 2,437,422 and German Offenlegungsschrift No. 3,227,584.

As a rule, these are polyaddition or polycondensation products of ring compounds (I) which contain two groups bound in an ester-like manner to carboxyl groups and also two carboxyl, chloroformyl, amino, isocyanate or hydroxyl groups arranged in the ortho or peri position thereto, with diamines, diisocyanates, bis(acid chlorides) or dicarboxylic acids which contain at least one cyclic structural element (II).

The preparation of the soluble polymer precursors contained in the photopolymerizable mixture is known from German Patent No. 2,308,830 and German Offenlegungsschrift No. 3,227,584 the contents of which are hereby incorporated by reference.

The following are mentioned as radiation-sensitive groups bound in an ester-like manner to carboxyl groups:

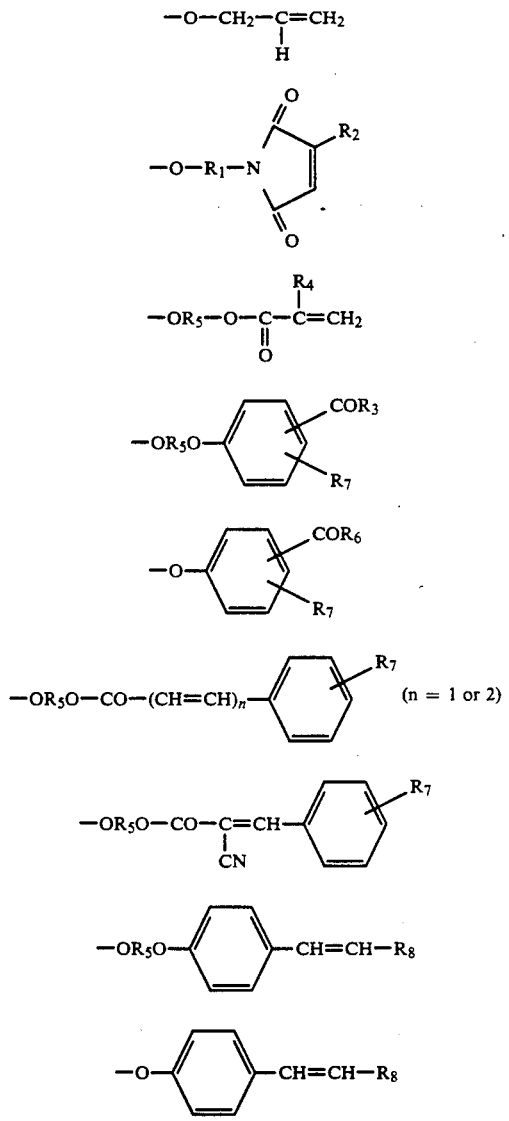

wherein
$R_1$ denotes alkylene, in particular $(C_1-C_6)$-alkylene, aralkylene, in particular phenyl$(C_1-C_3)$alkylene,
$R_2$ denotes H, $CH_3$, Cl,
$R_3$ denotes alkyl, in particular $(C_1-C_6)$alkyl, aralkyl, in particular phenyl$(C_1-C_3)$alkyl,
$R_4$ denotes H, $CH_3$,
$R_5$ denotes alkylene, in particular $(C_1-C_3)$-alkylene,
$R_6$ denotes alkyl, in particular $(C_1-C_3)$alkyl, phenyl, alkoxyphenyl, halophenyl,
$R_7$ denotes H, Cl, alkyl, alkoxyl, preferably containing 1 to 3 carbon atoms,
$R_8$ denotes a carbocyclic or heterocyclic aromatic radical bound via a ring carbon.

Of the radiation-active groups bound in an ester-like manner to carboxyl groups, the following may be highlighted: oxyallyl, oxyalkyl acrylate, oxyalkyl methacrylate, N-oxyalkyl or N-oxyalkylarylmaleimide. Of these, oxyallyl, 2-oxyethyl acrylate, 2-oxyethyl methacrylate and N-(m-β-oxyethoxy)phenylmaleimide groups are particularly preferred, of which the 2-oxyethyl acrylate and 2-oxyethyl methacrylate groups are even more preferred.

As the ring compounds I binding the radiation-active groups in a ester-like manner, aliphatic and aromatic polycarboxylic acids are used, which, if they are aromatic, are in particular monocyclic or bicyclic, but are not fused. They preferably contain four carboxyl groups or their anhydrides, acid halides and/or esters (partial esters), but are also dihydroxydicarboxylic acids or diaminodicarboxylic acids, such as, for example, in bis(4-hydroxy-3-carboxyphenyl)methane or 4,4'-diamino-3,3'dicarboxydiphenyl. Tetracarboxylic acid bis(anhydrides) and tetracarboxylic acid diester bis(acid chlorides) are preferred. In this connection, mention may be made of bicyclo[2.2.2]oct-7-ene-2,3,5,6-tetracarboxylic acid and derivatives thereof or pyromellitic acid, which is particularly preferred because of its easy availability and its high chemical stability. It is preferably used in the form of its dianhydride for the synthesis of the prepolymers.

Suitable ring compounds II are, according to the invention, all the diamines, diisocyanates, bis(acid chlorides) or dicarboxylic acids known for this purpose hitherto which contain at least one cyclic aromatic or heteroaromatic structural element. Preferred are mono- or bicyclic compounds, and of the bicyclic compounds, the bridged diphenyls are particularly preferred. Suitable bridges are a single bond, $-CH_2-$, $-NH-$, $-O-$, $-S-$, and $-SO_2-$.

Particularly preferred soluble polymer precursors are polycondensates of a pyromellitic acid which contains two (meth)acryloyl groups bound in an ester-like manner, and a diamine, for example 4,4'-diaminodiphenyl ether, 4,4'-diaminodiphenylmethane, 4,4'-diaminodiphenylsulfone or 2,4-diaminopyridine.

The polymer precursors contained in the mixture according to the invention have, as a rule, molecular weights ($M_n$) of about 2,000 to 100,000, preferably of about 4,000 to 60,000.

The compounds containing trihalomethyl groups used according to the invention in the photopolymerizable mixtures as photoinitiators are described in German Patent No. 2,718,259 and German Offenlegungsschrift No. 3,337,024, 3,333,450, 2,306,248 and 2,243,621, along with the methods of preparing them.

These are compounds in which an aromatic or heteroaromatic ring system substituted by trihalomethyl groups may conjugate with a further (hetero)aromatic system.

Preferably, they are compounds in which an aromatic or heteroaromatic ring system substituted by trihalomethyl groups is joined directly via an unsaturated ring carbon atom or via a carbonyl group to a further (hetero)aromatic system.

Mention may be made of compounds of type A containing trihalomethyl groups:

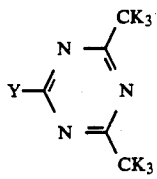

wherein
- Y denotes an optionally substituted aromatic or heterocyclic aromatic, optionally partially hydrogenated radical optionally bound via a conjugated alkenylene chain, in particular ($C_2$-$C_6$)-alkenylene, or preferably via an unsaturated ring carbon atom,
- K is a chlorine, bromine or iodine atom, preferably a chlorine atom.

The s-triazines containing trihalomethyl groups and bound via an alkenylene group to an aromatic or heteroaromatic system include, for example, 2-(4-methoxystyryl)-4,6-bis(trichloromethyl)-s-triazine, 2-(4-dimethylaminophenylbutadienyl)-4,6-bis(trichloromethyl)-s-triazine, 2-[3-(N-ethylbenzoxazolyl-2-idene)propen-1-yl]-4,6-bis-(trichloromethyl)-s-triazine.

Preferably, Y in the general formula A specified above is an optionally partially hydrogenated aryl or aralkenyl radical or a corresponding heterocyclic aromatic radical containing oxygen, sulfur or nitrogen as heteroatoms which is bound via an unsaturated ring carbon atom. It may also be a diphenyl radical. The nuclei of the radical Y may carry one or more substituents. If aryl is an unsubstituted phenyl radical, it is preferably bound to the s-triazine carrying trihalomethyl groups via a $C_2$-alkenylene group.

Examples of suitable di- and trinuclear aromatic radicals are naphthalene, anthracene, phenanthrene, quinoline, isoquinoline, benzofuran, benzopyran, dibenzofuran, benzothiophene, dibenzothiophene, acenaphthene, benzoxazole, fluorene, tetrahydrophenanthrene and dihydrophenalene, naphthalene being particularly preferred.

The following may be mentioned as examples of substituents: halogen, particularly chlorine and bromine, lower optionally substituted alkyl radicals containing preferably 1-3 carbon atoms, optionally substituted aryl radicals, nitro, sulfonyl, alkylmercapto, phenylmercapto, acyl, aryloxy, hydroxyl and preferably alkoxy radicals, particularly preferred being ($C_1$-$C_8$)-alkoxy radicals which are in turn substituted by halogen, phenyl or phenoxy and in which individual methylene groups may be replaced by oxygen or sulfur bridges, and also phenoxy, cycloalkoxy and alkenyloxy radicals.

Particularly preferred are s-triazines of the type A in which Y is a radical of the following formula:

here
- $Y_1$ denotes hydrogen or —$OY_3$, preferably —$OY_3$,
- $Y_2$ denotes H, Cl, Br, a lower alkyl, alkenyl or aryl radical, an optionally substituted ($C_1$-$C_4$)alkoxy radical, with hydrogen, a ($C_1$-$C_3$)alkyl or ($C_1$-$C_3$)alkoxy radical being particularly preferred, and
- $Y_3$ denotes a ($C_1$-$C_8$)alkyl radical which may be substituted by halogen, preferably chlorine or bromine, or aryl or aryloxy radicals and in which individual methylene groups may be replaced by oxygen or sulfur bridges, a cycloalkyl, alkenyl or aryl radical, in particular a ($C_1$-$C_4$)alkyl or alkoxyalkyl radical, or
- $Y_1$ and $Y_2$ together denote an alkylene radical which is preferably linked to the naphthalene nucleus to form a 5- or 6-member ring.

Also preferred are compounds in which the s-triazinyl radical and an alkoxy radical are arranged in the 1,4 or 2,6 position of the naphthalene nucleus.

Since the number of carbon atoms in the alkoxy groups affects the photochemical activity of the initiators only insignificantly, the limitation to eight carbon atoms in —$OY_3$ should not be regarded as a rigid limit, but it can optionally be exceeded, for example with nonyloxy, dodecyloxy or octadecyloxy radicals.

In detail, the following may be cited as particularly suitable organohalogen compounds:

2-(naphth-1-yl)-4,6-bis(trichloromethyl)-s-triazine,
2-(4-methoxynaphth-1-yl)-4,6-bis(trichloromethyl)-s-triazine,
2-(4-ethoxynaphth-1-yl)-4,6-bis(trichloromethyl)-s-triazine,
2-(4-butoxynaphth-1-yl)-4,6-bis(trichloromethyl)-s-triazine,
2-[4-(2-methoxyethyl)naphth-1-yl]-4,6-bis(trichloromethyl)-s-triazine,
2-[4-(2-ethoxyethyl)naphth-1-yl]-4,6-bis(trichloromethyl)-s-triazine,
2-[4-(2-butoxyethyl)naphth-1-yl]-4,6-bis(trichloromethyl)-s-triazine,
2-(2-methoxynaphth-1-yl)-4,6-bis(trichloromethyl)-s-triazine,
2-(6-methoxy-5-methylnaphth-2-yl)-4,6-bis(trichloromethyl)-s-triazine,
2-(6-methoxynaphth-2-yl)-4,6-bis(trichloromethyl)-s-triazine,
2-(5-methoxynaphth-1-yl)-4,6-bis(trichloromethyl)-s-triazine,
2-(4,7-dimethoxynaphth-1-yl)-4,6-bis(trichloromethyl)-s-triazine,
2-(6-ethoxynaphth-2-yl)-4,6-bis(trichloromethyl)-s-triazine,
2-(4,5-dimethoxynaphth-1-yl)-4,6-bis(trichloromethyl)-s-triazine and
2-(acenaphth-5-yl)-4,6-bis(trichloromethyl)-s-triazine
and also (with somewhat attenuated activity) 2-(naphth-2-yl)-4,6-bis(trichloromethyl)-s-triazine.

Particularly preferred are 2-(alkoxynaphth-1-yl)-4,6-bis(trichloromethyl)-s-triazines, in particular 2-(4-alkoxynaphth-1-yl)-4,6-bis(trichloromethyl)-s-triazines, such as, for example, 2-(4-ethoxynaphth-1-yl)-4,6-bis(trichloromethyl)-s-triazine.

Just as particularly preferred are compounds in which $Y_1$ and $Y_2$ together form an alkylene radical which is linked preferably with the naphthalene nucleus to form a 5- or 6-member ring. In particular, mention should be made in this connection of 2-(acenaphth-5-yl)-4,6-bis(trichloromethyl)-s-triazine.

Just as preferred are s-triazines of the type A in which Y is a radical of the following formula:

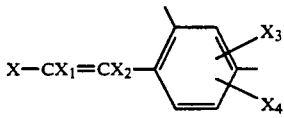

wherein
the phenyl group contains an s-triazine containing a trihalomethyl group, or hydrogen in the ortho or para position to the alkylene group, $X_1$ and $X_2$ denote hydrogen atoms or alkyl groups, $X_3$ and $X_4$ are identical or different and denote hydrogen or halogen atoms, or substituted or unsubstituted alkyl, alkenyl or alkoxy radicals and X is a substituted or unsubstituted mono- to trinuclear aromatic radical.

Preferred are compounds in which
$X_1$ and $X_2$ denote hydrogen atoms or methyl groups, particularly preferably hydrogen atoms, $X_3$ denotes a hydrogen atom, $X_4$ denotes a hydrogen, chlorine or bromine atom, an alkyl radical containing 1 to 3 carbon atoms, or a methoxy group, particularly preferably a hydrogen atom, and X denotes a phenyl radical of the formula

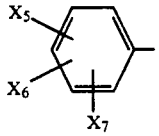

wherein
$X_5$ to $X_7$ are identical or different and denote hydrogen or halogen atoms, which are preferably fluorine, chlorine or bromine, alkyl radicals which are unsubstituted or are substituted by halogen atoms, preferably chlorine or bromine, aryl or aryloxy radicals and in which individual methylene groups may be replaced by oxygen or sulfur atoms, it being possible in each case for two of these radicals to be linked to form a 5- or 6-member ring, or cycloalkyl, alkenyl, aryl or aryloxy radicals, and the total number of carbon atoms of the radicals $X_5$ to $X_7$ is a maximum of 12

X may furthermore be a naphthyl, acenaphthyl, di- or tetrahydronaphthyl, indanyl, anthryl, phenanthryl, fluorenyl or tetrahydrophenanthryl radical which is optionally substituted by halogen, preferably chlorine or bromine atoms, alkyl radicals containing 1 to 3 carbon atoms, alkoxy radicals containing 1 to 4 carbon atoms or alkoxyalkyl radicals containing 3 to 6 carbon atoms.

Particularly preferred are compounds wherein
$X_1$, $X_2$, denote hydrogen atoms and
$X_3$ and $X_4$
$X_5$ to $X_7$ are identical or different and denote hydrogen, fluorine, chlorine or bromine atoms, or alkyl, alkoxy or alkoxyalkyl radicals, or $X_5$ denotes a hydrogen atom and $X_6$ and $X_7$ together denote a dioxymethylene group.

In particular, among the particularly preferred compounds, the radical X may, for example, have the following meanings: phenyl, 2-, 3- or 4-fluorophenyl, 2-, 3- or 4-chlorophenyl, 2-, 3- or 4-bromophenyl, 2-, 3- or 4-methyl, -ethyl-, -propyl-, -butyl-, -isobutyl-, -hexyl-, -nonyl- or -dodecylphenyl, 2-, 3- or 4-methoxy-, -ethoxy-, -isopropoxy-, -butoxy-, -pentoxy-, -octyloxy- or -decyloxyphenyl, 2,4-dichloro- or -dibromophenyl, 3,4-dichloro- or -dibromophenyl, 2,6-dichlorophenyl, 3-bromo-4-fluorophenyl, 2,3-, 2,4-, 2,5-, 3,4- or 3,5-dimethoxy-, -diethoxy-, -dibutoxy- or -dihexoxyphenyl, 2-ethoxy-5-methoxyphenyl, 3-chloro-4-methylphenyl, 2,4-dimethylphenyl, 2-, 3- or 4-methoxyethyl-, -ethoxyethyl- or -butoxyethylphenyl, 2,4,6-trimethylphenyl, 3,4,5-trimethoxy- or -triethoxyphenyl, 2,3-dioxymethylenephenyl or 3,4-dioxymethylenephenyl.

A very particularly preferred compound is 2-(4-styrylphenyl)-4,6-bis(trichloromethyl)-s-triazine.

Suitable photoinitiators according to the invention which should furthermore be mentioned are compounds of the type B:

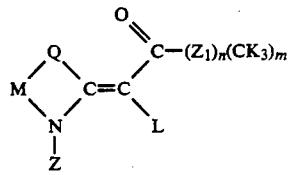

wherein
L denotes a hydrogen atom or a substituent of the formula CO—$(Z_1)n(CK_3)m$, M denotes a substituted or unsubstituted alkylene radical or alkenylene radical or a 1,2-arylene radical, Q denotes a sulfur, selenium or oxygen atom, a dialkylmethylene group, an alken-1,2-ylene radical, a 1,2-phenylene radical or an N-R group, M+Q together forming 3 or 4 ring members, Z denotes an alkyl, aralkyl or alkoxyalkyl radical, $Z_1$ denotes a carbocyclic or heterocyclic aromatic group, K denotes a chlorine, bromine or iodine atom and
n=0 and m=1 or
n=1 and m=1 or 2.

In the formula of the type B, L is preferably a hydrogen atom.

M is preferably a 1,2-phenylene radical which may optionally be substituted, for example by halogen atoms, carboxyl, sulfonic acid, nitro, cyano, carbonyl, alkyl, aryl, alkoxy, trifluoromethyl or alkoxycarbonylalkyl groups, but is preferably unsubstituted. M may also be a heterocyclic aromatic radical, for example a pyridylene radical. If M is a polynuclear aryl radical, it may contain 2 or 3, preferably 2, benzene rings. M may also be a 1,2- or 1,3-alkenylene radical which is optionally substituted, for example by halogen atoms, carboxyl, carbonyl, alkoxy, alkyl or aryl groups. M may further be a 1,1-, 1,2- or 1,3-alkylene radical which may also optionally carry substituents of the same kind.

Q is preferably a sulfur atom, an NR group or a dialkylmethylene group containing 3 to 13, preferably 3 to 7, in particular 3, carbon atoms. Q may also be an oxygen atom or selenium atom, a 1,2-alkenylene group, a 1,2-phenylene group, or a carbonyl or thiocarbonyl group. If Q is a dialkylmethylene group, the alkyl groups may be joined to each other to form a 5- or 6-membered ring. If Q is a 1,2-alkenylene group, it may be substituted, inter alia, by one or two alkyl or phenyl radicals, chlorine atoms, alkoxy groups or alkoxycarbonyl groups; if it denotes a 1,2-phenylene radical, it may contain as substitutents, for example, chlorine atoms, alkoxy or alkoxycarbonyl groups. Particularly preferably Q=S, in particular as a constituent of a 5-membered ring.

If Z is an alkyl or alkoxyalkyl radical, it may in general contain 1-10, preferably 1-6, carbon atoms. It may be straight-chain or branched or optionally cyclized to a cycloaliphatic radical, for example a cyclohexyl radical. Examples of aralkyl radicals are benzyl, chlorobenzyl, tolylmethyl and phenethyl radicals. Z is particularly preferably an alkyl radical containing 1-3 carbon atoms.

$Z_1$ is a mono- or dinuclear, preferably a mononuclear, aromatic group which is preferably carbocyclic. Examples of $Z_1$ are benzene, naphthalene, triazole, pyrimidine, pyridine, oxazole, imidazole, thiazole, oxdiazole, thiadiazole, furan, thiophene, pyrrole and isoxazole rings which are optionally substituted by halogen atoms, alkoxy groups or alkyl groups.

K is preferably a chlorine or bromine atom, in particular a chlorine atom. In general, compounds with n=1 are preferred.

Particularly advantageous is the use of the compound $B_1$

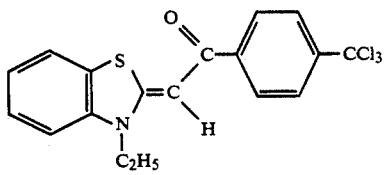

$B_1$

The photosensitive mixture contains about 0.5 to 30% by weight, preferably about 2 to 15% by weight (referred to the weight of the prepolymer), of the photoinitiator described.

According to the invention, the photosensitive mixture further contains, as monomers, suitable radiation-reactive polymerizable polyfunctional acrylic compounds, in particular esters and amides of (meth)acrylic acid. Mention should be made of trimethylolpropane trimethacrylate, trimethylolpropane triacrylate, trimethylolpropane ethoxylate trimethacrylate, trimethylolpropane ethoxylate triacrylate, trimethylolpropane polyethoxylate trimethacrylate, trimethylolpropane polyethoxylate triacrylate, pentaerythritol triacrylate, polyethylene glycol diacrylate, triethylene glycol diacrylate, polyethylene glycol dimethacrylate, polymethylene diacrylate, polymethylene dimethacrylate, trimethylene glycol dimethacrylate or mixtures thereof. Preferred are trimethylolpropane triacrylate, trimethylolpropane trimethacrylate, pentaerythritol triacrylate and also polyethylene glycol diacrylate.

The photosensitive mixture according to the invention contains about 5 to 40% by weight, preferably about 10 to 30% by weight (referred to the weight of the prepolymer), of at least one of the acrylic compounds described.

Suitable solvents of the photopolymerizable mixture according to the invention are, for example, ethylene glycol, glycol ethers such as glycol monomethyl ether, glycol dimethyl ether and glycol monoethyl ether, aliphatic esters such as ethyl acetate, hydroxyethyl acetate, alkoxyethyl acetate, n-butyl acetate or amyl acetate, ethers such as dioxane, ketones such as methyl ethyl ketone, methyl isobutyl ketone, cyclopentanone and cyclohexanone, dimethylformamide, dimethylacetamide, hexamethylphosphoric triamide, N-methylpyrrolidone, butyrolactone, tetrahydrofuran and mixtures of the same.

Particularly preferred are mixtures of N-methylpyrrolidone and cyclic ketones, in particular cyclopentanone. The mixing ratios are preferably 1:1 (ratios by weight).

The solutions produced with the other constituents of the photopolymerizable mixtures have, as a rule, a solids content of about 5 to 60% by weight, preferably up to about 50% by weight.

According to the invention, a photosensitive copying material is also provided which essentially consists of a substrate and a photopolymerizable mixture applied thereto.

Suitable substrates are all materials of which capacitors, semiconductors, multilayer printed circuits or integrated circuits may be composed or from which they can be manufactured. In particular, mention should be made of optionally doped surfaces composed of thermally oxidized and/or aluminum-coated silicon material, including all the other substrates usual in semiconductor technology, such as, for example, silicon nitride, gallium arsenide and indium phosphide. Also, substrates known from liquid crystal display production are also suitable, such as glass, indium/tin oxide; furthermore metal plates and foils, for example those composed of aluminum, copper, zinc; bimetallic and trimetallic foils, but also electrically nonconducting foils which are coated with metals by vapor deposition, and $SiO_2$ materials, optionally coated with aluminum, and paper. These substrates may be subjected to a temperature pretreatment, superficially roughened up, etched or treated with reagents to increase the hydrophilic nature.

The photopolymerizable mixtures applied to the substrates mentioned may have various layer thicknesses.

The layer thickness which is most advantageous in a particular case depends on various factors, for example the specific application of the material to be produced, the polymer precursor used in the individual case and the nature of the other components which may optionally be present in the radiation-sensitive layer. It has proved expedient as a rule if the resist layers have a thickness of about 0.1 to 100 μm, in particular about 1 to 10 μm.

In a particular embodiment, the photosensitive copying material may contain an adhesion promoter in the resist or between the resist and the substrate to improve the adhesion. In the case of silicon or silicon dioxide substrates, adhesion promoters of the aminosilane type are suitable for this purpose, and in particular 3-aminopropyltriethoxysilane should be mentioned.

A process for producing highly heat-resistant relief structures on a substrate is also a subject of the invention. The application of the photosensitive photopolymerizable layer to the substrate can be carried out by spraying, flow coating, rolling, spin-on coating and dip coating. Then the solvent is removed by evaporation so that the photosensitive layer remains behind on the surface of the substrate. The removal of the solvent may optionally be promoted by heating the layer to temperatures of up to 100° C. Then the layer is exposed to an image. Normally, actinic light is used, but high-energy radiation, such as X-ray or electron radiation, is used, i.e., the photoinitiators are always also radiation-sensitive. Equally, it is also possible to use, according to the invention, photoinitiators which become active only on exposure to high-energy radiation (German Offenlegungsschrift No. 2,610,842).

The irradiation or exposure may take place through a mask original, but a bundled light beam may also be guided over the surface of the radiation-sensitive layer. Normally, UV lamps which emit light of a wavelength from 200 to 500 nm with an intensity of 0.5 to 60 mW/cm² are used for the exposure. In the photosensitive layer, an image pattern is then uncovered by development, the layer being treated with a developer solution which removes the unexposed regions of the photoresist material.

As a rule, a mixture of one or more of the solvents specified for the production of photoresists with a non-solvent is used as developer solution. Typical developer solutions are, for example, 4-butyrolactone/toluene, dimethylformamide/ethanol, dimethylformamide/methanol, methyl ethyl ketone/ethanol and methyl isobutyl ketone/isopropanol, in each case in the ratio 2:1 to 1:4. However, it is also possible for developers to be used which contain only one component, of which cyclopentanone is preferred. After a short irradiation time, which as a rule is at least shorter by a factor 4 to 5 than the corresponding photoresist without the addition, according to the invention, of photoinitiators containing trihalomethyl groups and optionally without the polyfunctional acrylic compounds, followed by subsequent development, washing and drying, sharp-edged resist images with a resolution of less than 3 μm are obtained. As a result of heat treating the resist images at 200° to 400° C., the polymers contained in these images are converted into highly heat-resistant polymers. The good resolution is not impaired by the heat treatment.

The highly heat-resistant polymers have excellent chemical, electrical and mechanical properties. The photoresists according to the invention are suitable, for example, for producing protective layers on semiconductor components, on dielectric layers in the case of multilayer integrated circuits, as the last passivating layer on electric devices and also as the orienting layer of liquid-crystal display cells. The following examples explain the production of the photoresists according to the invention and their application.

EXAMPLE 1 a) Photoresist 28.8 g of polymer precursor (obtained by reacting pyromellitic anhydride with 2-hydroxyethyl methacrylate and then with thionyl chloride and 4,4'-diaminodiphenyl ether according to German Patent No. 2,437,348, Example 1), 2.8 g of trimethylolpropane trimethacrylate and 1.4 g of 2-(4-styrylphenyl)-4,6-bis(trichloromethyl)-s-triazine are dissolved in 67.0 g of a mixture of N-methylpyrrolidone and cyclopentanone (ratio by weight 1:1) and filtered through a 1 μm filter.

b) Application (1) A silicon wafer (diameter: 75 mm) covered with a thin silicon dioxide layer is treated with an aminosilane adhesion promoter by spinning a solution containing 0.2% by weight of 3-aminopropyltriethoxysilane at 4,000 rev/min onto the wafer and drying the wafer for 15 min at 110° C. Then the photoresist according to a) is spun on and dried by heating for one hour at 70° C. The 2.7 μm thick layer obtained is then exposed for 110 seconds through a step wedge (transmission: 1–100%) with a 350 W mercury high-pressure lamp with an intensity of 6–7 mW/cm² (measured at 365 nm) under nitrogen using the contact method.

The unexposed photoresist parts are then washed out by spray development with cyclopentanone. The thickness of the resist layer left at the parts of the layer exposed to various quantities of energy is measured and plotted as a percentage proportion of the initial layer thickness against the exposure energy (in mJ/cm²). The photosensitivity is determined by extrapolation of the resulting thickness versus energy curve to the 0% thickness base line.

The resultant exposure energy corresponds to the sensitivity value and is found to be 11 mJ/cm² in this example.

The wafer is then heated for 2 hours at 250° C. The portions of the resist layer subjected to the full exposure dose have a thickness of 1.7 μm after this step. This corresponds to a value of 63% of the initial layer thickness, i.e., the layer thickness before development.

(2) A silicon wafer is exposed and dried as in application (1) with the photoresist cited under a). The coated wafer is then exposed for 90 seconds through a mask using a 350 W mercury high pressure lamp under nitrogen using the contact method. The mask contains lines 1, 2, 3 and 4 μm wide which are situated at a distance of 1, 2, 3 and 4 μm. After exposure the unexposed photoresist parts are washed out by spray development with cyclopentanone. A sharp-edged image with a resolution of approximately 1.6 μm is obtained.

EXAMPLE 2 a) Photoresist 33.2 g of polymer precursor (described in Example 1), 3.4 g of trimethylolpropane trimethacrylate and 1.7 g of 2-(4-styrylphenyl)-4,6-bis(trichloromethyl)-s-triazine are dissolved in 61.7 g of a mixture of N-methylpyrrolidone and cyclopentanone (ratio by weight 1:1) and filtered through a 1 μm filter.

b) Application

Analogously to Example 1 b), a silicon wafer is coated with photoresist and dried. The layer thickness is 4.6 μm. The exposure and development conditions correspond to those in Example 1 b): a sensitivity value of 17 mJ/cm² is obtained. The image is sharp-edged and has a resolution of 5 μm. The portions of the resist layer subjected to the full exposure dose have a thickness of 2.7 μm after curing.

EXAMPLE 3-5 a) Photoresist

Analogously to Example 1, photoresists are produced from 28.8 g of polymer precursor (described in Example 1), 2.8 g of trimethylolpropane trimethacrylate and 1.4 g of the photoinitiators mentioned below 67.0 g of N-methylpyrrolidone and cyclopentanone (ratio by weight 1:1). The solution obtained is filtered through a 1 μm filter.

The following are used as photoinitiators:

Example 3: 2-(4-ethoxynaphth-1-yl)-4,6-bis(trichloromethyl)-s-triazine;

Example 4: 2-(acenaphth-5-yl)-4,6-bis(trichloromethyl)-s-triazine;

Example 5: benzothiazole compound $B_1$ which contains the trichloromethyl group via a phenyl group.

b) Application

In the case of application analogously to Example 1 b), sharp-edged images with a resolution of approximately 3 μm are obtained in each case after exposure for 110 seconds and development. If the step wedge from Example 1 b) is used and evaluation is carried out according to Example 1 b), the following sensitivity values are obtained:

Example 3: 14 mJ/cm$^2$
Example 4: 17 mJ/cm$^2$
Example 5: 3 mJ/cm$^2$.

In the following comparative examples, inter alia Michler's ketone was used as photoinitiator in accordance with European Patent Application 0,047,184 and German Offenlegungsschrift No. 3,227,584.

COMPARATIVE EXAMPLE 1

Analogously to Example 1, a photoresist is produced which contains 28.8 g of polymer precursor (described in Example 1),
2.8 g of trimethylolpropane trimethacrylate and
1.4 g of Michler's ketone in
67.0 g of a mixture of N-methylpyrrolidone and cyclopentanone (ratio by weight 1:1).

If applied analogously to Example 1 b), the exposure time has to be increased to at least 1,000 seconds to obtain a crisp image. A sensitivity value of 70 mJ/cm$^2$ is obtained.

COMPARATIVE EXAMPLE 2

Analogously to Example 1, a photoresist is produced which contains 31.6 g of polymer precursor (described in Example 1) and 1.4 g of Michler's ketone, in 67.0 g of a mixture of N-methylpyrrolidone and cyclopentanone (ratio by weight 1:1).

If applied analogously to Example 1 b), the exposure time has to be increased to at least 1,200 seconds to obtain an sharp-edge image. A sensitivity value of 160 mJ/cm$^2$ is obtained.

COMPARATIVE EXAMPLE 3

Analogously to Example 1, a photoresist is produced which contains:

31.6 g of polymer precursor (described in Example 1) and 1.4 g of 2-(4-styrylphenyl)-4,6-bis(trichloromethyl)-s-triazine, dissolved in 67.0 g of N-methylpyrrolidone/cyclopentanone (ratio by weight 1:1).

If used in accordance with Example 1 b), the irradiation time has to be increased to at least 160 seconds to obtain an sharp-edged image. A sensitivity value of 37 mJ/cm$^2$ is obtained.

What is claimed is:

1. A negative-working photopolymerizable mixture for producing a relief structure comprising highly heat-resistant polymers, said mixture consisting essentially of:

a soluble polymer precursor with a molecular weight (Mn) of about 2,000 to 100,000 having at least one unsaturated radial bound by an ester-linkage to a carboxyl group of the polymer precursor;

at least one monomer comprising a polyfunctional acrylic compound; and a photoinitiator having at least one trihalomethyl group that reacts on exposure to light represented by a compound of the type A

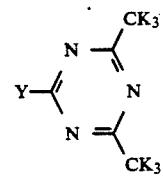

wherein

Y denotes an optionally substituted aromatic or heterocyclic aromatic, optionally partially hydrogenated radical optionally bound via a conjugated alkenylene chain, in particular ($C_2$-$C_6$)-alkenylene, or preferably via an unsaturated ring carbon atom, and K is a chlorine, bromine or iodine atom.

or a compound of the type B

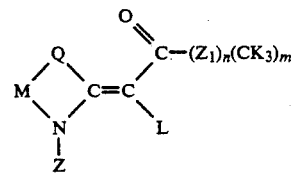

wherein

L denotes a hydrogen atom or a substituent of the formula CO—$(Z_1)_n(CK_3)_m$,

M denotes a substituted or unsubstituted alkylene radical or alkenylene radical or a 1,2-arylene radical, Q denotes a sulfur, selenium or oxygen atom, a dialkylmethylene group, an alken-1,2-ylene radical, a 1,2-phenylene radical or an N-Z group, M+Q together forming 3 or 4 ring members, Z denotes an alkyl, aralkyl or alkoxy radical, $Z_1$ denotes a carbocyclic or heterocyclic aromatic group, K denotes a chlorine, bromine, or iodine atom and n=0 and m=1 or n=2 and m=1 or 2.

2. A photopolymerizable mixture as claimed in claim 1, wherein the soluble polymer precursor is a polyaddition or polycondensation product.

3. A photopolymerizable mixture as claimed in claim 1, wherein the photoinitiator comprises an aromatic or heteroaromatic ring system substituted by trihalomethyl groups and capable of conjugation with another aromatic or heteroaromatic ring system.

4. A photopolymerizable mixture as claimed in claim 1, wherein the photoinitiator represents a compound of the type A

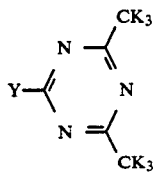

wherein
Y denotes an optionally substituted aromatic or heterocyclic aromatic, optionally partially hydrogenated radical optionally bound via a conjugated alkenylene chain, in particular $(C_2-C_6)$-alkenylene, or preferably via an unsaturated ring carbon atom, and
K is a chlorine, bromine or iodine atom.

5. A photopolymerizable mixture as claimed in claim 1, wherein the photoinitiator represents a compound of the type B

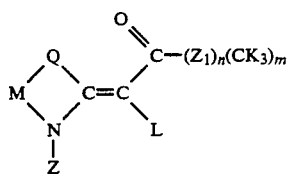

wherein
L denotes a hydrogen atom or a substituent of the formula $CO—(Z_1)_n(CK_3)_m$,
M denotes a substituted or unsubstituted alkylene radical or alkenylene radical or a 1,2-arylene radical,
Q denotes a sulfur, selenium or oxygen atom, a dialkylmethylene group, an alken-1,2-ylene radical, a 1,2-phenylene radical or an N-Z group,
M+Q together forming 3 or 4 ring members,
Z denotes an alkyl, aralkyl or alkoxy alkyl radical,
$Z_1$ denotes a carbocyclic or heterocyclic aromatic group,
K denotes a chlorine, bromine, or iodine atom and
n=0 and m=1 or
n=1 and m=1 or 2.

6. A photopolymerizable mixture as claimed in claim 1 comprising from 0.5 to 30% by weight of the photoinitiator, referred to the weight of the polymer precursor.

7. A photopolymerizable mixture as claimed in claim 1, wherein the monomer or mixture of suitable monomers is contained therein in an amount of 10 to 40% by weight, referred to the weight of the prepolymer.

8. A photopolymerizable mixture as claimed in claim 1 additionally comprising a solvent, wherein the resulting solution comprises a solids content of 5 to 60% by weight.

9. A photopolymerizable mixture as claimed in claim 3, wherein said ring system is conjugated with a further (hetero)aromatic system.

10. A photopolymerizable mixture as claimed in claim 1, comprising from 2 to 15% by weight of the photoinitiator, referred to the weight of the polymer precursor.

11. A photopolymerizable mixture as claimed in claim 1, wherein said polymer precursor comprises two unsaturated radicals bound by ester linkages to carboxyl groups.

12. A photopolymerizable mixture as claimed in claim 11, wherein said precursor comprises radicals substituted in ortho or peri positions relative to said ester linkages, said radicals being selected from the group consisting of carboxyl, carbonyl chloride, amino, isocyanate, and hydroxyl.

13. A photopolymerizable mixture as claimed in claim 1, comprising from 5 to 40% by weight of the monomer, referred to the weight of the prepolymer.

14. A photosensitive copying material comprising a substrate and a photosensitive layer, wherein the photosensitive layer comprises a photopolymerizable mixture as claimed in claim 1.

15. A photosensitive copying material as claimed in claim 14, wherein the substrate comprises a thermally oxidized and/or aluminum-coated silicon material and/or silicon nitride.

16. A photosensitive copying material as claimed in claim 14, further comprising an adhesion promoting layer between the substrate and the photosensitive layer.

17. A process for producing highly heat-resistant relief structures, comprising the steps of:
applying a solvent solution of a photosensitive photopolymerizable mixture as claimed in claim 1 to form a layer;
removing the solvent by heating the layer to temperatures of up to 100° C.;
imagewise exposing the layer; and
developing the layer to produce a relief structure.

18. The process as claimed in claim 17, wherein the developer consists essentially of a mixture of one or more of the solvents used for producing the photosensitive mixture and a nonsolvent.

19. The process as claimed in claim 18, additionally comprising the step of heat-treating relief structures at temperatures from 200° to 400° C. after the developing step.

20. A photopolymerizable mixture as claimed in claim 1, wherein said soluble precursor comprises a group selected from the group consisting of

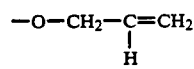

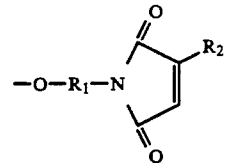

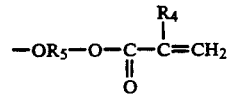

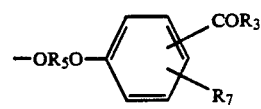

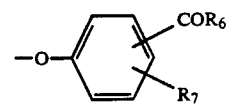

-continued

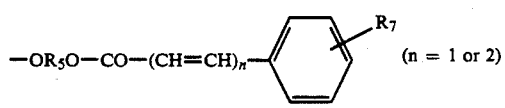 (n = 1 or 2)

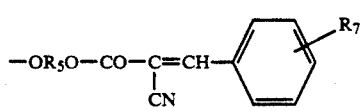

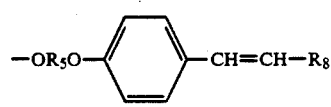

-continued

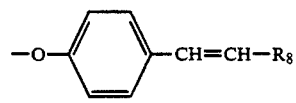

wherein
$R_1$ denotes alkylene, in particular $(C_1-C_6)$-alkylene, aralkylene, in particular phenyl $(C_1-C_3)$alkylene,
$R_2$ denotes H, $CH_3$, Cl,
$R_3$ denotes alkyl, in particular $(C_1-C_6)$alkyl, aralkyl, in particular phenyl$(C_1-C_3)$alkyl,
$R_4$ denotes H, $CH_3$,
$R_5$ denotes alkylene, in particular $(C_1-C_3)$-alkylene,
$R_6$ denotes alkyl, in particular $(C_1-C_3)$alkyl, phenyl, alkoxyphenyl, halophenyl,
$R_7$ denotes H, Cl, alkyl, alkoxyl, preferably containing 1 to 3 carbon atoms,
$R_8$ denotes a carbocyclic or heterocyclic aromatic radical bound via a ring carbon.

* * * * *